United States Patent Office 3,726,726

Patented Apr. 10, 1973

3,726,726

METHOD OF PRODUCING DIFFUSED HIGH-RESISTIVITY MICRORESISTORS

Yordan Dimitrov Kasabov, Sofia, Bulgaria, assignor to Tzentralen Institut za Elementi, Sofia, Bulgaria No Drawing. Filed Jan. 4, 1971, Ser. No. 103,929
Claims priority, application Bulgaria, Jan. 14, 1970, 13,746
Int. Cl. H01l 7/44
U.S. Cl. 148—187 2 Claims

ABSTRACT OF THE DISCLOSURE

A method of producing diffused high-resistivity microresistors in a silicon wafer wherein, after the surface of the wafer is cleaned and etched to provide windows, the wafer is heated in vacuum with $B_2O_3$ to deposit impurity boron atoms upon the surface and prediffuse boron into the windows. The prediffusion takes place at a temperature of the order of 800° C. After penetrating diffusion, the wafer is exposed at the same temperature to an oxidizing atmosphere to render the boron atoms susceptible to solubilization in HF. The surface is then treated with an HF etchant to remove the nondiffused impurity atoms.

SPECIFICATION

(1) Field of the invention

This invention relates to a method of producing high-resistivity diffused microresistors, used in the field of microelectronics.

(2) Background of the invention

A known diffusion method for producing resistors comprises the following operations: cleaning the surface of a semiconductor wafer of a given type of conductivity; prediffusing impurity atoms (giving the opposite type of conductivity); removing the nondiffused atoms of the impurity element from the surface; and effecting a deeper penetrating diffusion of the prediffused impurity atoms into the crystal lattice of the semiconductor wafer by a heat treatment in an inert atmosphere and then in an oxidizing atmosphere whereby, at the end of the operations the diffused resistors are covered with an insulating oxide layer. Although this method comprises a number of advantages and is readily realizable for the simultaneous production of a large number of resistors on one substrate, it does not enable the production of resistors of small surface area and high resistance. As a result, in MOS IC (metal oxide semiconductive integrated circuits), for example, MOS (metal-oxide semiconductor) transistors of low transconductance are used as microresistors, the gate of which is connected directly to the supply voltage source or to another specially provided voltage source, this voltage being constant or pulsed. The use of an MOS transistor in this way is an advantage with respect to conservation of surface area, but causes significant complications, especially if the supply voltage is fed directly to the gate of the load transistors. For separate gate control, a separate metal strip is required which means a loss in surface area and a decrease in integration scale, a significant drawback of the use of an MOS transistor as a load. A further drawback of MOS IC using load MOS transistors is the increase of thin-oxide area which leads directly to a reduction of the output and reliability as a result of the increased breakdown probability for the thin oxide. Another drawback of MOS IC with load MOS transistors is the reduction of their speed, and also, the need for a high supply voltage as a result of the nonlinearity and the threshold voltage of the load MOS transistor. The use of high voltage leads on the other hand to additional problems: the need for a high breakdown voltage of the diffusion regions and consequently, a longer channel, large area transistors, and finally a low scale of integration, high parasitic capacitances and reduced speed of the MOS IC; increased power consumption since the dissipation power increases approximately with the square of the supply voltage; increased danger of gate breakdown and hence the need for a thicker oxide layer below the gate which leads to a reduction in yield and integration scale of the integrated circuit; the formation of parasitic transistors which means an insulated oxide of greater thickness because of the need for a sufficiently high thick oxide threshold voltage, and hence additional reduction of the integration scale of the IC (integrated circuit); and a noncompatability of the high voltages in the MOS IC with those used in bipolar transistors and circuits.

It is seen from the foregoing that the use of load MOS transistor leads to significant complications in devices with a large number of MOS IC combined or not combined with bipolar transistors or integrated circuits. By introducing suitable microresistors instead of load MOS transistors, all these drawbacks are avoided, provided that it is possible to produce them using convenient, reliable and efficient production technology compatible with the entire technology for the production of integrated circuits.

The method of ion implantation is known for obtaining layers with very high sheet resistivities. In this method instead of introducing impurity atoms in the semiconductor by means of diffusion, the impurity ions are accelerated up to an energy of 80 to 300 kev. and then, by means of a focusing device separating the ions by mass, ions of the required impurity are selected and directed towards the surface of the semiconductor. This method, however, leads to considerable damage of the semiconductor surface and the insulating layers on it, the insulating layers being removed partially by a suitable heat treatment. The obtained p-n junctions have strong leakage currents as a result of the above-mentioned damage. The threshold voltages can be strongly influenced, too. Furthermore, the method of ion implantation requires expensive, complex and low-productive equipment.

(3) Objects of the invention

It is therefore, a general object of the present invention to provide a simple and efficient method for the production of microresistors of high resistance and a small surface area, thereby accomplishing large scale integration of IC.

(4) Description of the invention

This object is attained, according to the present invention, by carrying out, on the basis of a diffusion method, a prediffusion process at a low temperature of the order of 800° C., and removing the nondiffused impurity atoms initially by their transformation into a form soluble in HF by heating in oxidizing atmosphere and subsequently etching in a solution containing HF.

By the method of the invention, it is possible to produce high-resistivity microresistors with high sheet resistivity by utilizing all advantages of the diffusion method. The method solves the problem of high production of high-resistivity microresistors in microelectronic devices and in MOS IC in particular.

(5) Specific example

For a better understanding of the invention, a specific example will be described for production of high-resistivity microresistors on a n-type silicon wafer by diffusion of boron atoms, usng diboric trioxide as a source of the diffusible impurity.

Initially, the surface of a mechanically polished silicon wafer is cleansed by the usual washing technique, and is then rinsed in de-ionized water. The wafer, cleaned in this way, is then oxidized and processed by conventional planer technology, and windows for the resistors are etched with size: $L=75\mu$, $w=7.5\mu$, and a length-to-width ratio $L/w=10$. After fresh washing, the wafer is placed in a quart tube in which there is a small boat containing diboric trioxide. The tube is closed hermetically and evacuated to a vacuum of $10^{-2}$ mm. Hg. Then a prediffusion is carried out at 810° C. for 30 min., whereby the boron atoms diffuse into a thin layer of the bare silicon surface. Dry oxygen is introduced for about 3–4 min. to transform the non-introduced atoms into a form soluble in HF. The silicon wafer is taken out of the tube and placed in the etchant $HF:H_2O=1:10$ for removing the oxidized non-diffused boron atoms. Then the wafer is rinsed with de-ionized water.

The wafer is placed again in a quartz tube, where a penetrating diffusion is carried out, and water vapor is introduced to oxidize the bare silicon surface. This oxidizing process is carried out at the same temperature (i.e., 810° C.) for 40 min. As a result, the whole silicon wafer has an insulating layer of silicon dioxide, and the value of the produced resistors is 120 kohms, measured across both ends. The production of high-resistivity resistors of different value can be achieved by suitable combinations of temperatures and durations of prediffusion and oxidation.

The described method, according to the present invention, permits the production of high-resistivity resistors of extremely small surface area. They find application in all fields of microelectronics and especially in the production of LSI integrated circuits, since their production technology is quite compatible with the technology used in the production of integrated circuits and can be adequately included in the production process. For example, the aforedescribed production technology can be used for bipolar circuits in cases when high resistances are required, i.e. in micro-power and other similar circuits. The same technology can also be used for the production of super-miniature high-resistivity microresistors separately or combined in suitable groups of separate semiconductors chips and connected by thermocompression, or by another technique in hybrid or other miniature circuits. Substantial advantages are achieved by using the method in the design and production of MOS IC, and MOS LSI IC, the advantages including: use of low supply voltages, production of MOS IC with high output levels, security with respect to the threshold voltages, possibility for producing high-speed circuits, increased yields and reliability.

What is claimed is:

1. In a method of producing a diffused high-resistivity microresistor by the steps of:

cleaning the surface of a silicon wafer and etching windows thereon;

prediffusing into the etched windows of said surface impurity atoms of boron while coating said surface with nondiffused impurity atoms;

heating the wafer in an inert atmosphere to effect penetration of the prediffused impurity atoms into the wafer; and oxidizing said surface to insulate the same, the improvement wherein:

said atoms of boron are prediffused into said windows of said surface by heating said wafer in vacuum at a temperature of the order of 800° C. in the presence of $B_2O_3$;

said wafer is heated to said temperature subsequent to penetration of the prediffused impurity atoms into the wafer in an oxidizing atmosphere to render the nondiffused impurity atoms on said surface susceptible to solubilization in an HF etchant; and said surface is treated with HF etchant subsequent to the heating of the wafer in said oxidizing atmopshere to remove the susceptible nondiffused impurity atoms.

2. The improvement defined in claim 1 wherein said oxidizing atmosphere is water vapor.

References Cited

UNITED STATES PATENTS

| | | | |
|---|---|---|---|
| 3,203,840 | 8/1965 | Harris | 148—187 |
| 3,404,451 | 10/1968 | So | 148—187 X |
| 3,312,577 | 4/1967 | Dunster et al. | 148—187 |
| 3,575,742 | 4/1971 | Gilbert | 148—187 |
| 3,604,107 | 9/1971 | Fassett | 148—187 X |
| 3,498,853 | 3/1970 | Dathe et al. | 148—187 |

GEORGE T. OZAKI, Primary Examiner

U.S. Cl. X.R.

148—189; 252—62.3 E; 317—240; 29—576